US012132454B2

(12) United States Patent
Gruner et al.

(10) Patent No.: US 12,132,454 B2
(45) Date of Patent: Oct. 29, 2024

(54) RADIOFREQUENCY POWER AMPLIFIER (71) Applicant: COMET AG, Flamatt (CH)

(72) Inventors: Daniel Gruner, Müllheim (DE);
Andreas Hartmann, Hürtgenwald (DE); Philippe Dennler, Mühleberg (CH); Markus Reiff, Eschweiler (DE); André Grede, Bern (CH); Anton Labanc, Ehrenkirchen (DE)

(73) Assignee: COMET AG, Flamatt (CH)

( * ) Notice: Subject to any disclaimer, the term of this patent is extended or adjusted under 35 U.S.C. 154(b) by 519 days.

(21) Appl. No.: 17/415,546

(22) PCT Filed: Dec. 12, 2019

(86) PCT No.: PCT/EP2019/084967
§ 371 (c)(1),
(2) Date: Jun. 17, 2021

(87) PCT Pub. No.: WO2020/126852
PCT Pub. Date: Jun. 25, 2020

(65) Prior Publication Data
US 2022/0060160 A1 Feb. 24, 2022

(30) Foreign Application Priority Data
Dec. 21, 2018 (GB) ..................... 1821113

(51) Int. Cl.
*H03F 1/52* (2006.01)
*H01J 37/32* (2006.01)
(Continued)

(52) U.S. Cl.
CPC ........ *H03F 3/245* (2013.01); *H01J 37/32183* (2013.01); *H03F 3/195* (2013.01);
(Continued)

(58) Field of Classification Search
CPC .... H03F 3/245; H03F 3/195; H03F 2200/444; H03F 2200/451; H03F 2200/541;
(Continued)

(56) References Cited

U.S. PATENT DOCUMENTS

| 3,317,856 | A | * | 5/1967 | Wilkinson | ........ H02M 7/53846 363/134 |
| 3,961,280 | A | * | 6/1976 | Sampei | .................. H03F 1/0244 330/296 |
| 5,003,271 | A | | 3/1991 | Swanson | |
| 5,151,852 | A | * | 9/1992 | Jacobson | ................ H02M 3/01 363/16 |
| 7,180,758 | B2 | * | 2/2007 | Lincoln | ............... H02M 7/5387 363/56.06 |
| 7,532,076 | B2 | | 5/2009 | Hanada et al. | |
| 9,748,864 | B2 | | 8/2017 | Luu | |
| 10,396,720 | B2 | | 8/2019 | Grede et al. | |

(Continued)

FOREIGN PATENT DOCUMENTS

| CN | 101141115 A | 3/2008 |
| CN | 107735945 A | 2/2018 |

(Continued)

*Primary Examiner* — Khanh V Nguyen
(74) *Attorney, Agent, or Firm* — The Webb Law Firm (57) ABSTRACT A radiofrequency, RF, power amplifier, including at least one field-effect transistor, FET, wherein a source terminal of the at least one FET is connected to ground. At least one diode is included, wherein a cathode of the at least one diode is connected to a drain terminal of the at least one FET and an anode of the at least one diode is connected to ground. An output network is connected to the drain terminal of the at least one FET. An input network is connected to a gate terminal of the at least one FET.

15 Claims, 8 Drawing Sheets (51) Int. Cl.
*H03F 3/195* (2006.01)
*H03F 3/24* (2006.01)

(52) U.S. Cl.
CPC ........ *H03F 1/523* (2013.01); *H03F 2200/444* (2013.01); *H03F 2200/451* (2013.01); *H03F 2200/541* (2013.01)

(58) Field of Classification Search
CPC ............ H03F 1/523; H03F 3/193; H03F 1/52; H03F 3/217; H03F 2200/78; H01J 37/32183; H01J 37/32174; H01J 37/32082; H02M 1/348; H02M 1/08; H02M 1/32; H02M 7/538; H01L 27/0255; H03G 3/3042
USPC .............................................. 330/207 A, 298
See application file for complete search history.

(56) References Cited

U.S. PATENT DOCUMENTS

| | | | |
|---|---|---|---|
| 10,615,755 B2* | 4/2020 | Grede | H01J 37/32174 |
| 10,666,206 B2 | 5/2020 | Coumou et al. | |
| 2003/0215373 A1* | 11/2003 | Reyzelman | H01J 37/32174 |
| | | | 422/186.29 |

FOREIGN PATENT DOCUMENTS

| | | |
|---|---|---|
| DE | 102011087807 A1 | 6/2013 |
| JP | 2006115255 A | 4/2006 |
| JP | 2017521032 A | 7/2017 |
| JP | 2018519758 A | 7/2018 |
| JP | 2018533855 A | 11/2018 |
| KR | 1020170027714 A | 3/2017 |
| WO | 2017001599 A1 | 1/2017 |

* cited by examiner

RADIOFREQUENCY POWER AMPLIFIER

CROSS-REFERENCE TO RELATED APPLICATIONS

This application is the United States National Phase of International Application No. PCT/EP2019/084967 filed Dec. 12, 2019, and claims priority to British patent application no. 1821113.6 filed Dec. 21, 2018, the disclosures of which are hereby incorporated by reference in their entirety.

BACKGROUND OF THE INVENTION

Field of the Invention

The present disclosure generally relates to a radiofrequency, RF, power amplifier, a generator comprising the RF power amplifier and a plasma system configured to be connected to an output of the RF power amplifier.

Description of Related Art

RF power amplifiers are useful for providing output power in a variety of applications including plasma tools, fabrication of semiconductors (e.g. deposition, etching and modification of thin films), medical devices (e.g. electrosurgical devices and medical imaging machines such as magnetic resonance imaging, MRI, machines), food packaging, commercial surface modifications and coatings. RF power amplifiers include transistors as part of power amplification modules that can fail if not suitably protected. Herein, radiofrequency energy is in the range 300 hertz to 300 Gigahertz.

There are a number of failure mechanisms for a transistor. As the transistor failure is irreversible and causes collateral damage on the chip, it can be difficult to identify how the transistor failed. For a field effect transistor, for example, the isolating layer of the gate may be destroyed if the voltage between gate and source exceeds a critical level. This failure can happen very quickly, but can be avoided by limiting the applied gate voltage. Another failure mechanism may be overheating of the transistor caused by excessive power dissipation either when the transistor is open and the voltage and current are simultaneously present and their product is too high or the transistor is closed, but due to over-voltage a punch-through or avalanche breakdown occurs and the product of applied voltage and avalanche current is high enough to overheat the transistor. As this failure is thermal and relatively slow, it can be avoided by fast control loop monitoring of the load of an amplifier and reducing its power faster than overheating can occur. Yet another failure mechanism is "snap-back", the triggering of the parasitic bipolar junction transistor in a FET structure. The conditions causing snap-back are complex, comprising drain voltage, drain voltage increase rate (dV/dt) and/or drain current. This failure mechanism is extremely fast and cannot be avoided by a software control loop.

Even a momentary mismatch of the load impedance (arc discharge in the plasma) causes reflection of RF power such that the peak voltage at the transistor, for example at the drain of an FET, comprised in the amplifier, may reach or exceed its breakdown voltage. The increase rate of the voltage (dV/dt) may be much higher than during operation in matched load. An amplifier circuit may comprise one or more high ruggedness transistors which are arranged to withstand, for example, an overvoltage causing breakdown by converting the energy to heat and transferring it to a heatsink. There are some cases, especially at lower frequency amplifiers, that one or more of the high ruggedness transistors in a conventional amplifier circuit are destroyed despite this ruggedness characteristic of the transistor. Detailed experimental investigations have shown that, for example, during an arc discharge in a plasma causing failure of one or more transistors within a few RF periods, the voltage at the transistor drain exceeds its breakdown voltage and/or voltage increase rate (dV/dt) is several times higher than during normal operation into a matched load. Another detailed investigation of FET based amplifiers with high output power has shown that even in a case when the drain voltage and dV/dt remain below their critical values the snap-back mechanism might be triggered and the FET may fail during one half of a RF cycle.

A power RF generator for plasma industry must be rugged enough to operate with full output power to any mismatched load, at least for the time needed to reduce the power according a derating curve in order to protect active and passive components against overheating. Additional stress that the generator must withstand is the accumulated energy in matching networks flowing back to the generator in case of sudden mismatch (e.g. arcing in plasma) often resulting in higher reflected than incident power for a couple of RF periods.

Solid state amplifiers in such generators are typically populated with field-effect transistors, such as VDMOS (Vertically Diffused Metal-Oxide Semiconductor) or LDMOS (Laterally Diffused Metal-Oxide Semiconductor) FET (Field-Effect Transistor). LDMOS-FETs have low parasitic capacities and thermal resistance resulting in high power density. Power LDMOS FETs are available as XR (Extra-Rugged), intended to withstand over-voltages and over-currents caused by even fully mismatched operation for the time necessary to derate the RF power and/or to tune the matching network. Some such amplifiers are arranged as push-pull amplifiers which provide considerable advantages over a single-ended amplifier configuration. In order to achieve the same output power level, a push-pull configuration with e.g. two transistors has favorable impedance which is four times higher compared to a single-ended amplifier configuration in which the two transistors are connected in parallel. This enables the implementation of output matching networks with less losses and increased bandwidth. Furthermore, the push-pull arrangement inherently offers a proper termination for the even harmonic frequencies and no further complex circuits have to be implemented for even harmonic termination.

An important draw-back of MOSFETs, especially of LDMOS FETs, is the presence of a parasitic bipolar junction transistor, BJT, in the MOSFET structure. The parasitic BJT is normally closed. If triggered, the MOSFET cannot be controlled by the gate anymore and fails after a short time if the supply voltage is not immediately switched off. It is not normally possible to switch off the supply voltage when the parasitic BJT is triggered. There are two published mechanisms of triggering the parasitic BJT. One is a heavy avalanche breakdown exceeding the allowed avalanche energy of the transistor (typically more than 1 Joule in case of XR LDMOS FETs) or very fast switching on (high dV/dt) causing current to flow through a parasitic capacitance into the base of the parasitic BJT.

The present inventors have also observed failures of connected LDMOS FETs, particularly those in push-pull amplifier arrangements, under heavy mismatch conditions after a few RF cycles in the time where neither too high voltage nor dV/dt has been applied to the transistors of the RF power amplifier.

Accordingly, it is desirable to provide an RF power amplifier that includes circuitry to protect transistors thereof from failure and damage. The RF power amplifier desirably includes such protective circuitry without unduly increasing the circuitry footprint and cost of the power amplifier. Furthermore, other desirable features and characteristics of the present disclosure will become apparent from the subsequent detailed description of the disclosure and the appended claims, taken in conjunction with the accompanying drawings and the background of the disclosure.

SUMMARY OF THE INVENTION

In one aspect, a radiofrequency, RF, power amplifier is provided, including at least one field-effect transistor, FET, and at least one diode connected between each drain of the at least one FET and ground.

In another aspect, a radiofrequency, RF, power amplifier is provided, including at least one field-effect transistor, FET, wherein a source terminal of the at least one FET is connected to ground. At least one diode is included, wherein a cathode of the at least one diode is connected to a drain terminal of the at least one FET and an anode of the at least one diode is connected to ground. An output network is connected to the drain terminal of the at least one FET, and an input network is connected to a gate terminal of the at least one FET.

In embodiments, a first diode is connected between a drain of a first FET and ground and a second diode is connected between a drain of a second FET and ground. In embodiments, the first and second FETs are connected in a push-pull arrangement.

In embodiments, the drains of first and second FETs are connected by a passive matching network (an output matching network).

It has been found by the present inventors that, in certain operating conditions, reverse current is received at the drain of an FET in an RF power amplifier. In case of mismatched load, this can be caused by an inductive drain load in a single ended or push-pull FET RF power amplifier. In a push-pull arrangement with two FETs, a reverse current at the drain of the first FET can be caused by the second FET at capacitive loads. Such reverse current can be accompanied by an injection of charge carriers in the body region and enabling triggering of the parasitic BJT even when neither excessive voltages nor excessive dV/dt have been applied to the FETs. The diodes are arranged between the drains and ground and serve to route an effective portion (or all) of the reverse current, thereby lowering the likelihood of parasitic BJT being triggered and thus protecting the at least one FET from failure or damage.

In embodiments, the RF power amplifier has an operating frequency range of 100 kHz to 200 MHz. In embodiments, the RF power amplifier has an operating frequency range of up to 100 MHz. In additional or alternative embodiments, the RF power amplifier has an operating frequency range of at least 400 kHz.

In embodiments, the RF power amplifier has an output power at least 100 W. In embodiments, the RF power amplifier has an output power of at least 200 W. In embodiments, the RF power amplifier has an output power of at least 250 W.

In some embodiments, a plurality of parallel pairs of FETs in push-pull arrangement is included in the RF power amplifier.

In embodiments, the FETs are Laterally Diffused Metal-oxide Semiconductor (LDMOS) FETs.

In embodiments, the diodes are silicon Schottky-barrier diodes. In other embodiments, PN-junction silicon diodes or GaAs or SiC or GaN Schottky diodes are used.

In embodiments, at least two parallel diodes are connected between a drain of each FET and ground.

In embodiments, the cathode of the diode or each diode is connected to the drain of the FET and the anode of the diode or each diode is connected to ground, directly or via a positive voltage source. In some embodiments, anodes of the protective diodes are not connected directly to ground, but to a positive voltage source, wherein a negative terminal of the positive voltage source is connected to ground.

In embodiments the at least two FETs are driven with gate (input) signals of unequal phase. In embodiments, the at least two FETs are driven with gate (input) signals 180° out of phase.

In embodiments comprising at least two connected FETs, source terminals of the at least two FETs are connected to ground.

In embodiments including at least two connected FETs, a transformer is connected to the drains of the at least two FETs, the diodes connected to ground between the transformer and the drains of the at least two FETs. That is, one terminal of a first of the diodes is connected to a conductor between the drain of one of the FETs and a first terminal of the transformer and the other terminal of the first of the diodes in connected to ground. One terminal of a second of the diodes is connected to a conductor between the drain of the other of the FETs and a second terminal of the transformer and the other terminal of the second of the diodes in connected to ground.

In embodiments, the transformer is a planar transformer. In embodiments, a primary winding and a secondary winding of the transformer are planar and stacked relative to one another with at least one insulative layer therebetween.

In embodiments, at least one capacitor is connected between drains of the at least two FETs.

In embodiments, a capacitor is respectively connected between each drain of the at least one FET and ground. Each capacitor is connected to ground in parallel to a connection of the diode to ground.

In embodiments, the diode or diodes are integrated in the same package as the at least one FET, are integrated on the same die as the FET or are external to the package or die of the at least one FET.

In embodiments, the RF amplifier includes two or more FETs, e.g. in one package, or a push-pull of, for example, two FETs and two parallel FETs (for example, in one package).

In embodiments, the diode or diodes are external to the at least one FET structure in the sense that they are not body diodes of the at least one FET. However, the diodes may be included in the same package as the at least one FET as described heretofore.

In another aspect, a generator is provided that comprises a radiofrequency, RF, power amplifier, comprising at least one field-effect transistor, FET, and a diode connected between each drain of the at least one FET and ground, a control circuit configured to generate input signals for the at least one FET, a DC power supply (e.g., an AC/DC converter) configured to supply the RF power amplifier with DC power, and an output which is configured to output amplified power of the at least one RF power amplifier.

In another aspect, a plasma system is provided that comprises a generator including a radiofrequency, RF, power amplifier, comprising at least one field-effect transistor (FET), and a diode connected between each drain of the at least one FET and ground, a control circuit configured to generate input signals for the at least one FET, a DC power supply (e.g., an AC/DC converter) configured to supply the power amplifier with DC power, and an output which is configured to output amplified power of the at least one RF power amplifier. The plasma system further includes a plasma tool connected to the output and configured to generate plasma using the output amplified power.

In embodiments, the plasma tool includes a plasma chamber. In embodiments, the plasma chamber includes supply devices for supplying chemical components, such as processing gases, for use in plasma generation. Such plasma tools are useful in fabrication of semiconductors (e.g. deposition, etching and modification of thin films), for medical devices (e.g. electrosurgical devices and medical imaging machines such as magnetic resonance imaging, MRI, machines), food packaging, commercial surface modifications and coatings, etc.

The aforementioned embodiments of the RF power amplifier aspect are applicable to the generator and plasma system aspects.

BRIEF DESCRIPTION OF THE DRAWINGS

The present disclosure will hereinafter be described in conjunction with the following drawing figures, wherein like numerals denote like elements.

DETAILED DESCRIPTION OF THE INVENTION

The following detailed description is merely exemplary in nature and is not intended to limit the disclosure or the application and uses of the disclosure. Furthermore, there is no intention to be bound by any theory presented in the preceding background or the following detailed description.

Figure 1:
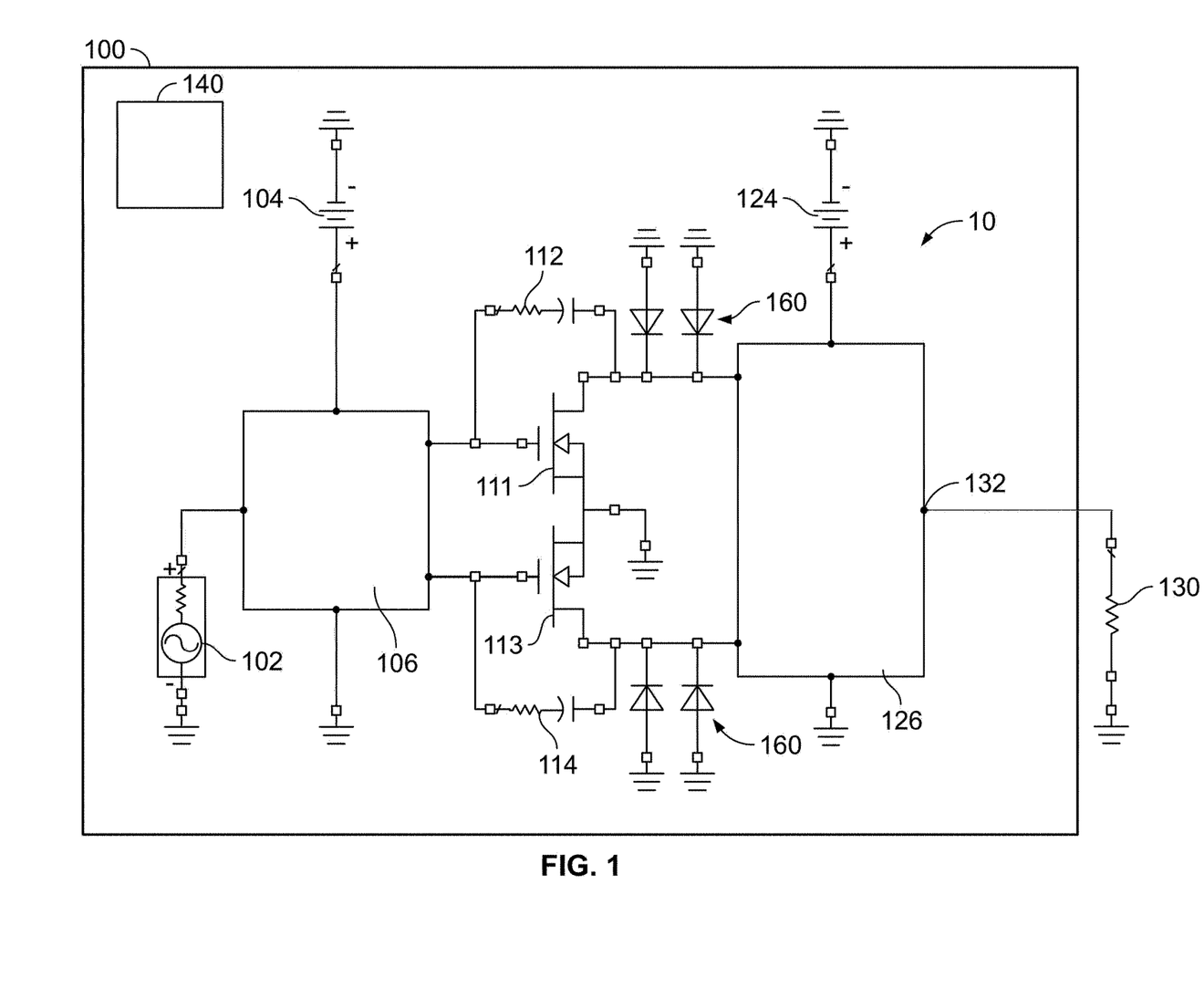
FIG. 1 is a circuit diagram of a RF power amplifier including FETs connected in push-pull arrangement and protective diodes, in accordance with various embodiments.

FIG. 1 is a principal sketch of a circuit for a RF power amplifier 10 comprising first and second FETs 111, 113 connected in push pull arrangement. An input network 106 matches an impedance of a signal source 102 with an impedance of gates of the FETs 111, 113. The input network 106 stabilizes the amplifier circuit and comprises resistors, in some embodiments. A gate bias voltage is provided by a gate bias voltage source 104 via the input network 106 in order to control bias currents of the FETs 111, 113. Drains of the FETs 111, 113 which are arranged in a push pull arrangement are connected with an output network 126 matching an impedance of a load 130 (e.g. impedance of a plasma chamber during operation) to a desired impedance at the drain reference plane of the FETs 111, 113. Various input and output networks 106, 126 for performing the stated matching function are known in the art. An output 132 of the RF power amplifier 10 is connectable to the load 130.

The circuit 10 includes, in this embodiment, stabilizing feedback circuits 112, 114. The stabilizing feedback circuits 112, 114 reduce amplification of the FETs 111, 113 in order to avoid unwanted oscillations of the FETs 111, 113. Stabilizing feedback circuits 112, 114 include resistors and capacitors connected in series in the present embodiment and are respectively connected between each drain of the FETs 111, 113 and the gates. A DC voltage supply 124 supplies DC voltage to the FETs 111, 113 via the output network 126. In embodiments, where dual FETs are provided in one package, the sources of the FETs 111, 113 are connected to ground. In embodiments, the FETs 111, 113 are VDMOS (Vertical-Diffusion Metal-Oxide Semiconductor) FETs or LDMOS (Lateral-Diffusion Metal Oxide Semiconductor) FETs (sometimes also called Lateral-Diffusion Metal Oxide Semiconductor).

In embodiments, the RF power amplifier 10 is included in a generator 100 including a control circuit 140 and the DC power supply 124 The control circuit 140 is configured to receive sensed parameters (e.g. voltage and current or incident and reflected power) of power output by the RF power amplifier 10 to the load 130 and to responsively adjust control signals of the signal source 102 and/or the DC voltage of the DC voltage supply 124 to achieve, for example, a set output power at a targeted output frequency. The generator 100 includes, in some embodiments, an AC to DC converter constituting the DC voltage supply 124. Although not shown in FIG. 1, more than one circuit including FETs 111, 113 can be included in the generator 100 and the power therefrom combined.

In accordance with various embodiments, the RF power amplifier 10 of the generator 100 is configured to provide power output at frequency ranges of 0.1 MHz to 200 MHz and in power ranges of at least 100 W.

In accordance with various embodiments, the RF power amplifier 10 includes protective diodes 160 having one terminal (cathode) connected to respective drains of the FETs and another terminal (anode) connected to ground. In this way, any excessive reverse current that could promote snap-back damage to the FETs 111, 113 is diverted to ground when the threshold voltage of the diodes 160 is surpassed. The diodes 160 are selected to have properties such that a sufficient amount of, or all, reverse current flowing towards the drains of the FETs 111, 113 is passed to ground such that the FETs are protected therefrom. In the present embodiment, a first pair of protective diodes 160 are respectively connected between ground and a line connecting the drain of a first of the FETs 111, 113 and the output network 126 and a second pair of protective diodes are respectively connected between ground and a line connecting the drain of a second of the FETs 111, 113 and the output network 126. In other embodiments, more than two protective diodes 160 can be provided on each side of the FETs 111, 113 for further reduction of the impedance of the diodes and/or to effectively distribute dissipated power. In yet other embodiments, a single protective diode is provided on each of the FETs 111, 113.

In embodiments, power Schottky-barrier diodes are utilized as the protective diodes, which are connected parallel to each FET 111, 113 (cathode to drain, anode to source/ground) to conduct negative current around the FETs 111, 113. In examples, the protective diodes 160, e.g. silicon Schottky-barrier diodes, have a lower threshold voltage than the body diodes of the FETs 111, 113. Other types of diodes, such as PN-junction silicon diodes or GaAs or SiC or GaN Schottky diodes, are used as the protective diodes 160 in other embodiments.

In accordance with various embodiments, the FETs 111, 113 are included in a package (not shown) and the protective diodes 160 are connected externally thereto. A package is the protective features and enclosures built into the electronic components. The package must consider protection from mechanical damage, cooling, radio frequency noise emission and electrostatic discharge. Exemplary packages include system and package (SAP), system on chip (SOC) "on die" and chip and wire assemblies. In other embodiments, the protective diodes 160 are integrated in the package. In various embodiments, the circuit of the RF power amplifier 10 is provided on a circuit board such that the FETs 111, 113 and the protective diodes 160 are included on the same die.

Figure 2:
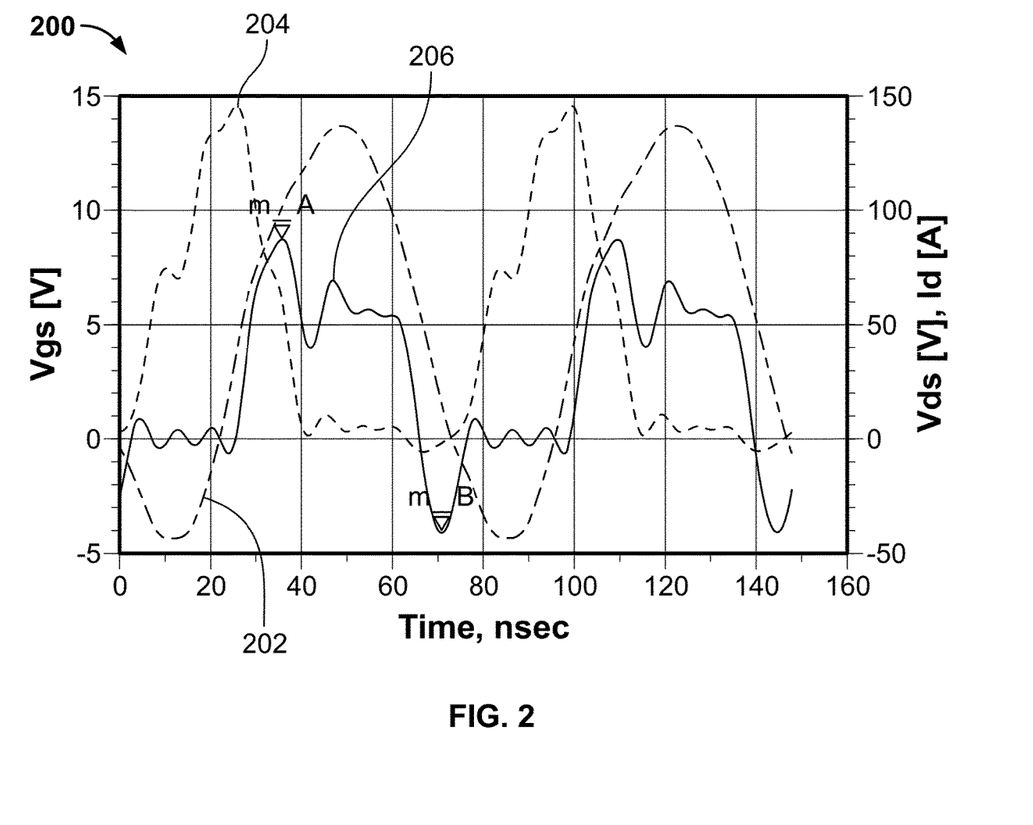
FIG. 2 is a graph showing gate voltage, drain voltage and drain current of an RF power amplifier similar to that of FIG. 1 but without protective diodes for purposes of comparison with FIG. 3A.

FIG. 2 is a graph 200 illustrating gate voltage 202, drain voltage 204 and drain current 206 versus time in a circuit for RF amplification under strong mismatch similar to that shown in FIG. 1 except without the protective diodes 160 for one side of the push-pull arranged FETs 111, 113. The phase of the mismatched load indicates a capacitive load seen by the FETs. The other side of the push-pull arranged FETs 111, 113 is identical but shifted in time by half of an RF period (i.e. 180° out of phase). At the time of marker m_A, one of the FETs 111, 113 is switched on whilst having still about 90V on its drain (hard switching) resulting in a drain current peak. It has been observed that this current can flow through the push-pull matching network (a passive network connecting drains of the FETs 111, 113) into the other of the FETs 111, 113 at the time of marker m_B. This negative or reverse current is being conducted by the channel of the other FET when the other FET is switching off. The current continues to flow through the body diode of the other FET causing the body region to be flooded by charge carriers just before the FET switches off and the drain voltage rises (positive dV/dt, but not necessarily too high). Under such conditions, the parasitic BJT can be triggered and at least one of the FETs can fail.

Figure 3A:
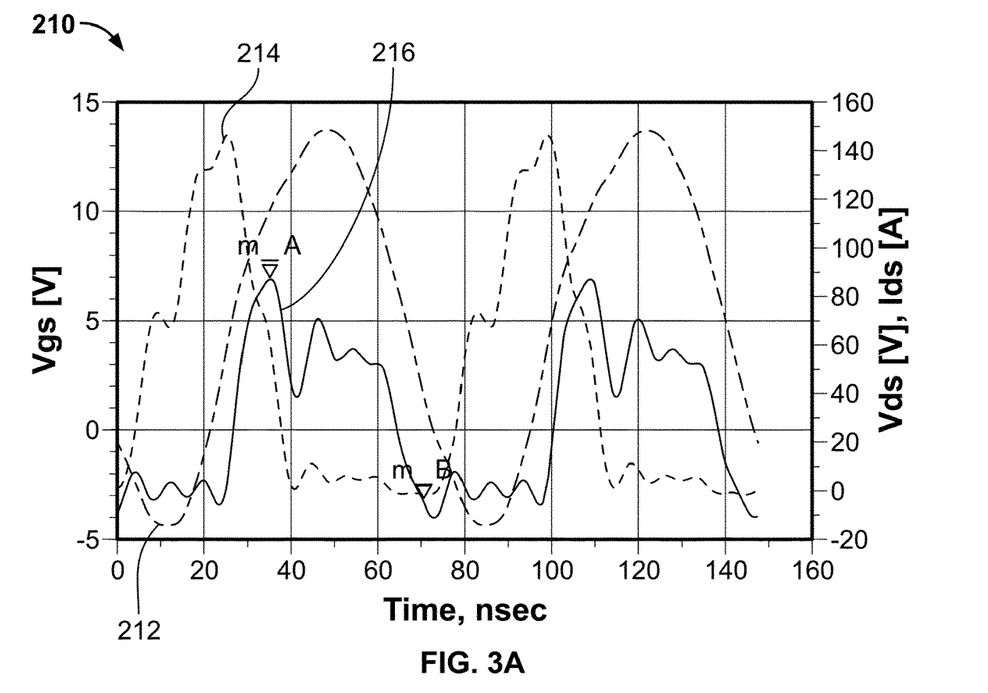
FIG. 3A is a graph showing gate voltage, drain voltage and drain current of one side of a push-pull arrangement of the circuit of FIG. 1, in accordance with various embodiments.
Figure 3B:
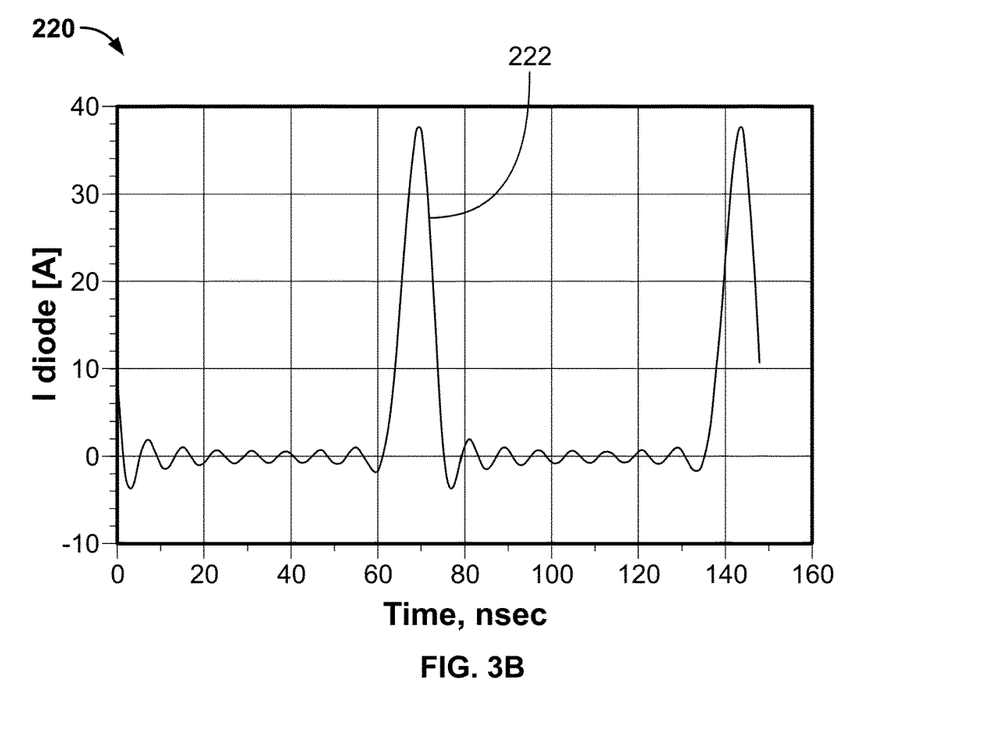
FIG. 3B is a graph showing diode current in the circuit of FIG. 1, in accordance with various embodiments.

FIG. 3A shows a similar graph 210 to that of FIG. 2, illustrating gate voltage 212, drain voltage 214 and drain current 216 versus time in a circuit for RF amplification according to that shown in FIG. 1 for one side of the push-pull arranged FETs 111, 113. By connecting protective diodes 160 between the drains and ground of each FET, the negative current that can flood the other FET is diverted to ground. In FIG. 3B, diode current 222 is illustrated against time. As can be seen, the reverse current at time m_B passes through the protective diodes 160, thereby protecting the FETs 111, 113 from conditions that can allow parasitic BJT to readily trigger, and thus protecting the FETs 111, 113 from consequent failure.

Figure 4:
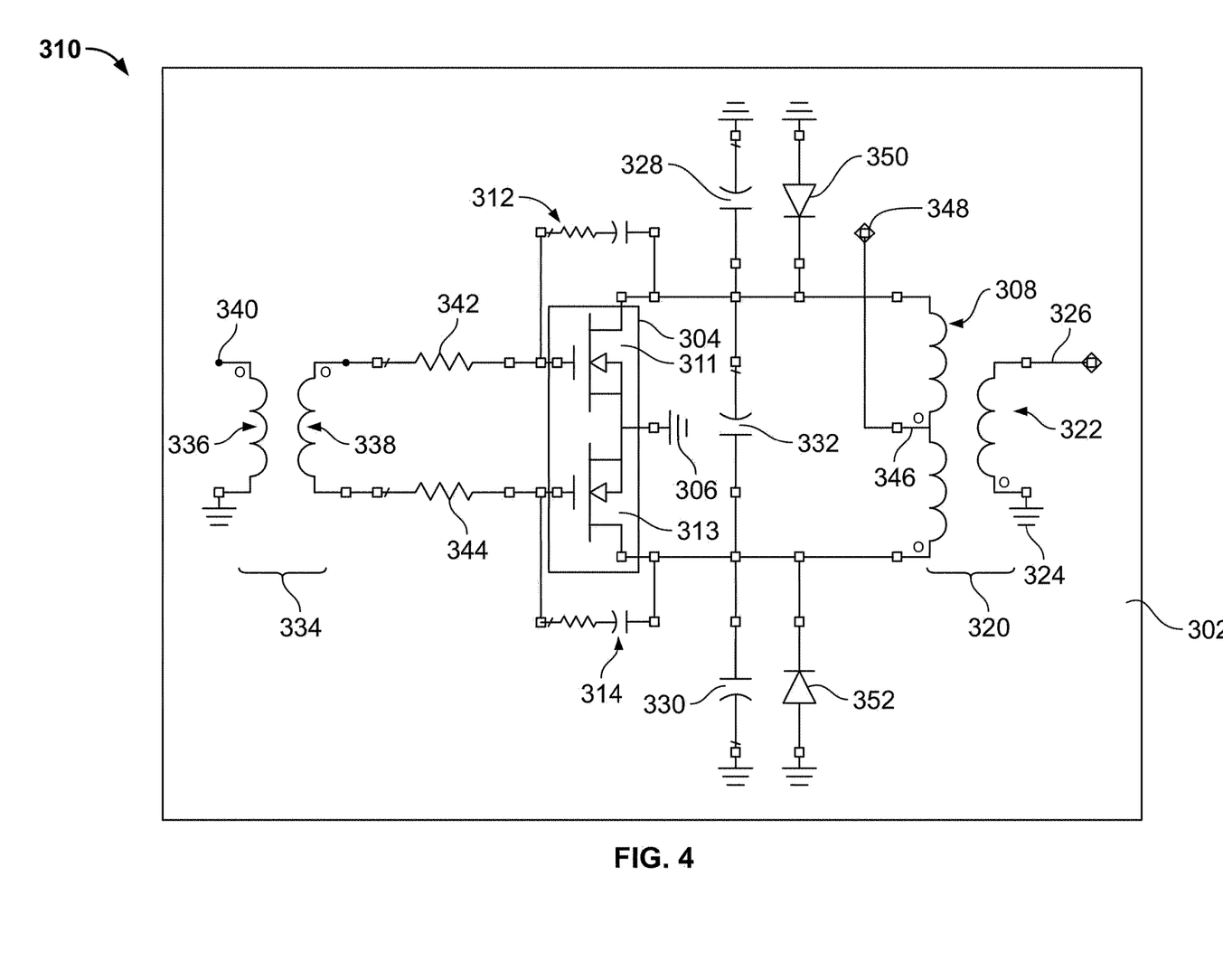
FIG. 4 is a circuit diagram of another RF power amplifier including FETs connected in push-pull arrangement, protective diodes and capacitors connected in parallel to the protective diodes, in accordance with various embodiments.

FIG. 4 shows another embodiment of a RF amplifier 310. The RF amplifier 310 includes a circuit board 302 on which a package 304 is arranged. The package 304 includes first and second FETs 311, 313, which are embodied alike and are each connected to a ground connection point 306 by their respective source terminals. It should be appreciated that the circuit board 302 is schematic and provided by way of illustration.

To stabilize the high-frequency amplifier arrangement 310, stabilizing feedback circuits 312, 314 are provided from the drain terminals of the FETs 311, 313, such as LDMOS FETs, to the gate terminals. The stabilizing feedback circuits 312, 314 each include a series circuit having a resistor and a capacitor.

The FETs are each connected, by the drain terminals thereof, to an end of a primary winding 308 of an output transformer 320, which is part of an output network (not described further herein). The primary winding 308 of the output transformer 320 comprises a center tap 346 for supplying DC power to the FETs from a DC voltage supply 348. The output network 126 of the circuit of FIG. 1 will similarly include such a transformer. The secondary winding 322 of the output transformer 320 is connected to ground 324 and with its other terminal connected to an RF output 326. RF power can be output through the RF output 326, e.g., directly to a load such as a plasma tool or to further circuits as e.g. sensing or filter or matching networks.

The drain terminals of the FETs are in each case connected to ground via a capacitor 328, 330 (forming part of the output matching network). The capacitors 328, 330 assist in increasing the impedance experienced by the drains at even harmonics frequencies, especially at $2^{nd}$ harmonic frequency in order to increase the efficiency of amplifier. Further, a capacitor 332 (or more capacitors in parallel) is connected between the two drains of the two FETs 311, 313 (as part of the output matching network) in order to provide the desired load impedance at the fundamental operating frequency at the drain reference plane of the FETs and to reduce the impedance experienced by the drains of the FETs at odd, especially at the $3^{rd}$ harmonic frequency in order to increase the efficiency of amplifier.

In embodiments, the RF amplifier 310 further includes an input transformer 334, which includes a primary winding 336 that is connected to an RF signal input terminal 340. A driving RF power can be provided to the RF amplifier 310 through the RF input signal terminal 340. The secondary winding 338 of the input transformer 334 is connected to the gate terminal of the first FET 311 by a resistive element 342, e.g., a resistor. The secondary winding 338 is also connected to the gate terminal of the second FET 313 by a resistive element 344, e.g., a resistor. The resistive elements 342, 344 and the input transformer 334 are part of an input network. The input network 106 of FIG. 1 includes an input transformer and resistive elements similar to that shown in FIG. 4.

As has been described with respect to FIG. 1, a generator comprises the RF power amplifier 310 of FIG. 4 in some embodiments. The output power from plural such power amplifiers 310 is combined, in embodiments. Such a generator includes a control circuit for adjusting DC power supply 348 and/or RF signal source 340 to achieve a set power at a desired frequency based on parameters of sensed power on output 326.

In accordance with various embodiments, the RF power amplifier 310 of FIG. 4 includes first and second protective diodes 350, 352. The first protective diode 350 is connected between the drain terminal of the first FET 311 and ground at a tapping point located between the drain terminal of the first FET 311 and a first terminal of the primary winding 308 of the power transformer 320. The second protective diode 352 is connected between the drain terminal of the second FET 313 and ground at a tapping point located between the drain terminal of the second FET 313 and a second terminal of the primary winding 308 of the power transformer 320. The protective diodes 350, 352 serve to pass reverse current (or at least an effective portion thereof) to ground, thereby protecting the FETs 311, 313 against potentially damaging conditions whereby parasitic BJT is easily triggered even by non-excessive dV/dt or drain peak voltages.

Figure 5:
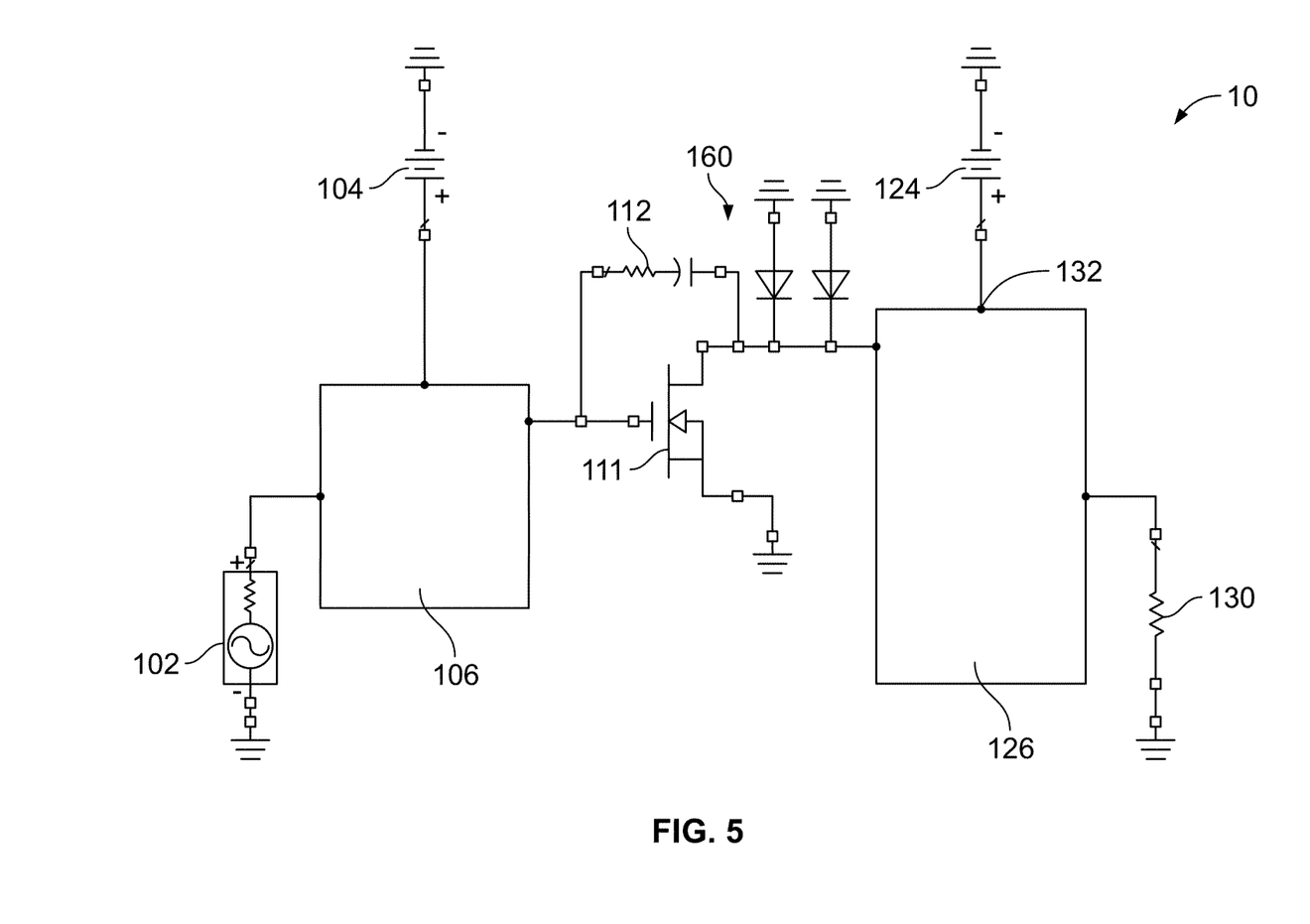
FIG. 5 is circuit diagram of yet another RF power amplifier including a single-ended FET, in accordance with various embodiments.

FIG. 5 provides a yet further embodiment of a RF power amplifier 10. The same reference numerals to those used with respect to FIG. 1 are included to designate like components. The embodiment of FIG. 5 differs from that of FIG. 1 by including a single FET 111 having its source terminal connected to ground. In the embodiment of FIG. 5, a pair of protective diodes 160 is connected in parallel to each other between the drain terminal of the FET 111 and ground. However, a single protective diode 160 or more than two protective diodes 160 are included in other embodiments. A plurality of such power amplifiers 10 is connectable to provide combined output power.

Figure 6:
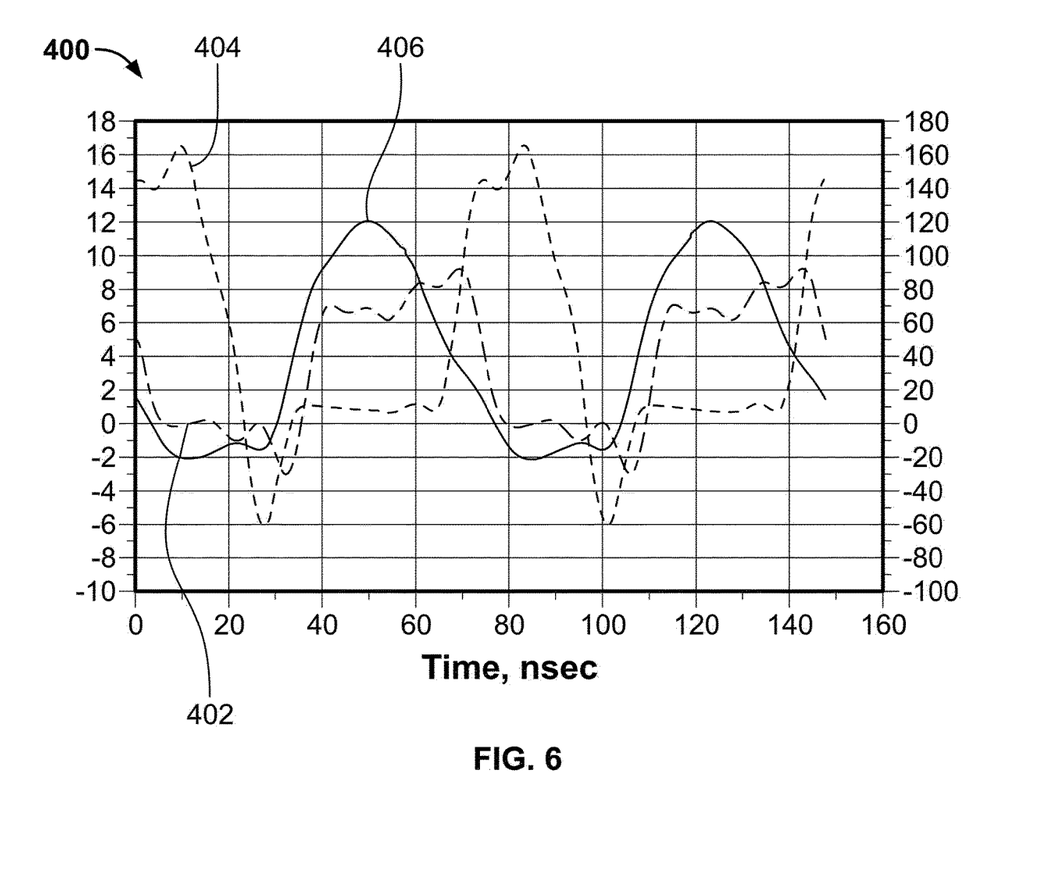
FIG. 6 is a graph showing gate voltage, drain voltage and drain current of an RF power amplifier similar to that of FIG. 5 but without protective diodes for purposes of comparison with FIG. 7A.

FIG. 6 is a graph 400 illustrating gate voltage 402, drain voltage 404 and drain current 406 versus time in a circuit for RF amplification similar to that shown in FIG. 5 except without the protective diode 160. It has been found that the FET 111 can fail when there is an inductive load, even in single-ended transistor arrangement such as that shown in FIG. 5.

Figure 7A:
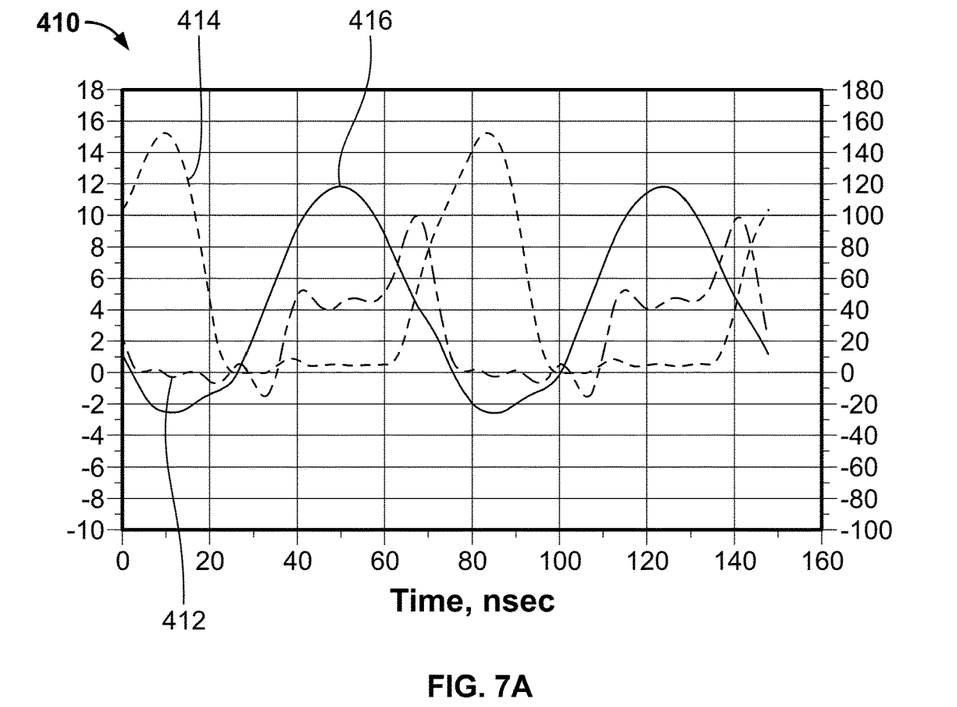
FIG. 7A is a graph showing gate voltage, drain voltage and drain current for the transistor of the circuit of FIG. 5, in accordance with various embodiments.
Figure 7B:
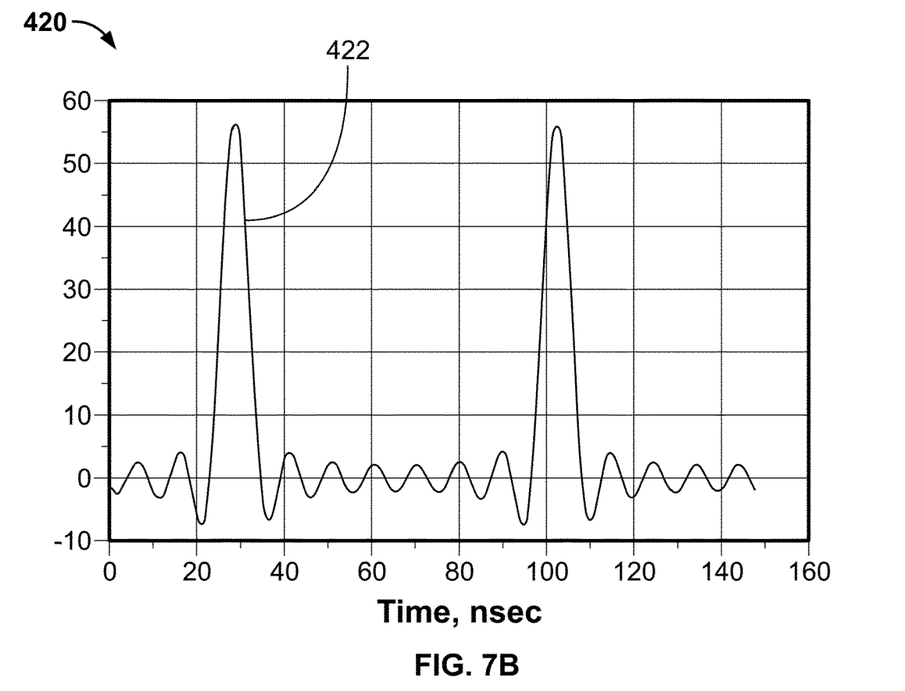
FIG. 7B is a graph showing diode current in the circuit of FIG. 5, in accordance with various embodiments.

FIG. 7A shows a similar graph 410 to that of FIG. 6, illustrating gate voltage 412, drain voltage 414 and drain current 416 versus time in a circuit for RF amplification according to that shown in FIG. 5. In this case the amplifier operates at a strongly mismatched load with phase resulting in inductive drain load. As can be seen from the suppressed negative portion of drain voltage 414 as compared to that in FIG. 6, the diode 160 is able to protect the FET 111 in other amplifier arrangements than push-pull topologies. Such protective take-up of reverse current is illustrated in the graph 420 of FIG. 7B showing diode current 422 of the protective diode 160 against time.

Figure 8A:
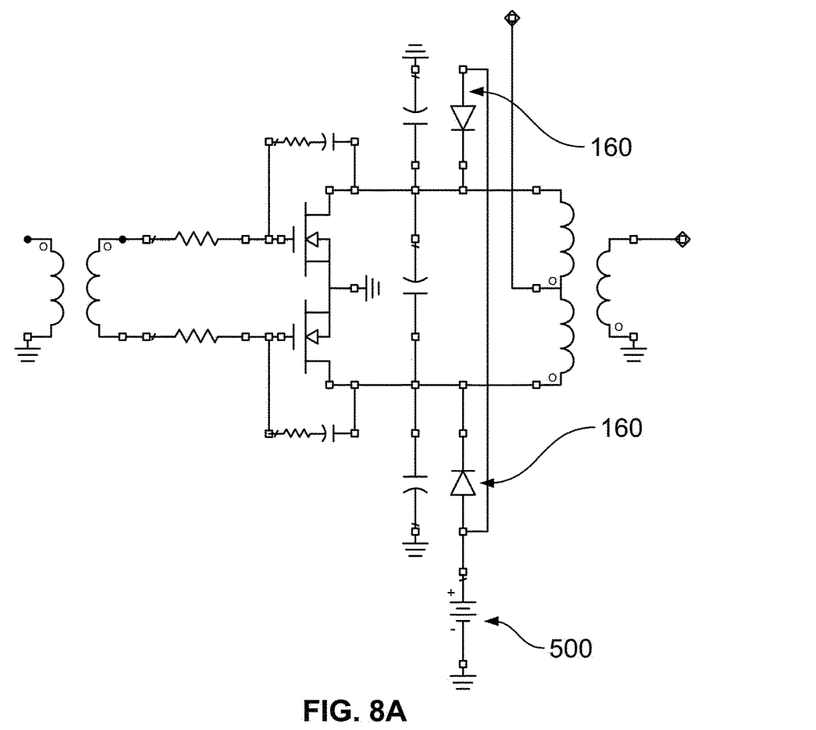
FIG. 8A is a circuit diagram of a further RF power amplifier including protective diodes, in accordance with various embodiments.
Figure 8B:
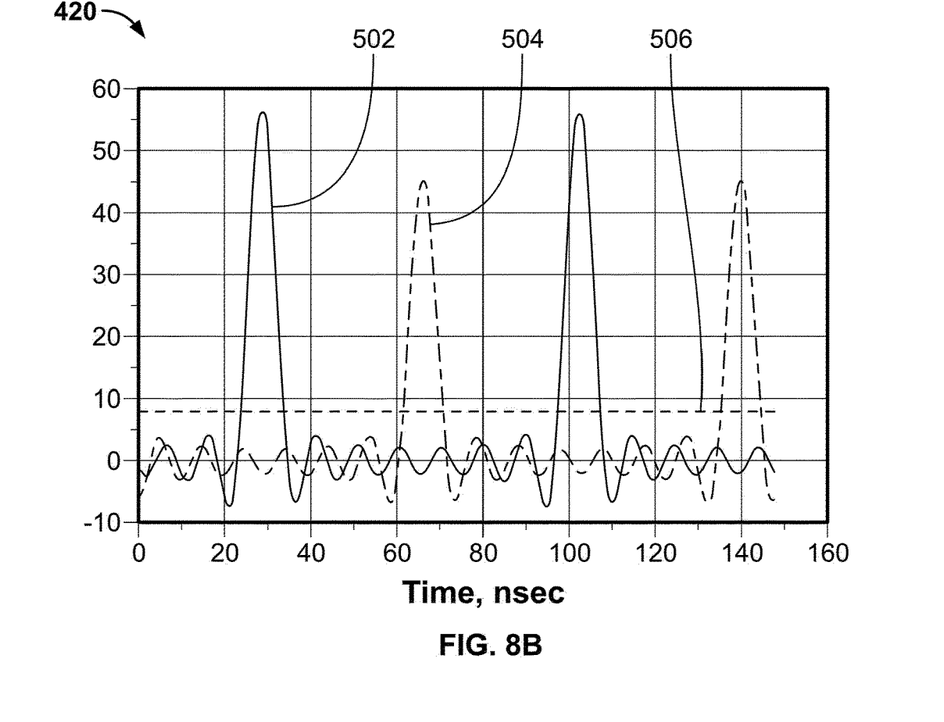
FIG. 8B is a graph showing diode current in the circuit of FIG. 8A, in accordance with various embodiments.

In some embodiments, and with reference to FIG. 8A, anodes of the protective diodes 160 are not connected directly to ground but to a positive voltage source 500. Such an embodiment is especially (but not exclusively) useful when the protective diodes 160 include one or more parallel connected protective diodes 160 (for example, SiC Schottky diodes) having built-in voltage higher than the built-in voltage of the PN junction of body diode. The voltage source 500 is able to compensate the built-in voltages of the protective diodes 160. The negative terminal of the voltage source is connected to ground. FIG. 8B shows the diode current 502 in the circuit of FIG. 8A for a first of the protective diodes 160 and the diode current 504 of a second of the protective diodes 160. Also shown in FIG. 8B is the output voltage 506 from the positive voltage source 500.

In accordance with various embodiments, the generators and power amplifiers described herein are useful to power plasma tools.

While at least one exemplary aspect has been presented in the foregoing detailed description of the disclosure, it should be appreciated that a vast number of variations exist. It should also be appreciated that the exemplary aspect or exemplary aspects are only examples, and are not intended to limit the scope, applicability, or configuration of the disclosure in any way. Rather, the foregoing detailed description will provide those skilled in the art with a convenient road map for implementing an exemplary aspect of the disclosure. It being understood that various changes may be made in the function and arrangement of elements described in an exemplary aspect without departing from the scope of the disclosure.

What is claimed is:

1. A radio frequency (RF) power amplifier, comprising:
    at least one field-effect transistor (FET) wherein a source terminal of the at least one FET is connected to ground;
    at least one diode, wherein a cathode of the at least one diode is connected to a drain terminal of the at least one FET and an anode of the at least one diode is connected to ground;
    an output network connected to the drain terminal of the at least one FET; and
    an input network connected to a gate terminal of the at least one FET,
    wherein the at least one diode has a lower threshold voltage than a body diode of the at least one FET.

2. The RF power amplifier of claim 1, wherein the at least one FET comprises at least two FETs wherein the at least two FETs are configured to be driven with input signals of unequal phase, wherein the output network comprises at least one transformer and at least one diode is connected between each drain terminal of the at least two FETs and ground.

3. The RF power amplifier of claim 2, wherein the at least two FETs are configured to be driven with a plurality of input signals 180 degrees out of phase.

4. The RF power amplifier of claim 2, wherein the at least one transformer is a planar transformer.

5. The RF power amplifier of claim 1, wherein the at least one diode is connected to ground via a positive voltage source.

6. The RF power amplifier of claim 1, comprising at least two parallel diodes connected between the drain terminal of the at least one FET and ground.

7. The RF power amplifier of claim 2, wherein the output network comprises at least one capacitor connected between each drain terminal of the at least two FETs.

8. The RF power amplifier of claim 1, wherein the output network comprises at least one capacitor connected between the drain terminal of the at least one FET and ground.

9. The RF power amplifier of claim 1, having an operating frequency within the range of 100 kHz to 200 MHz.

10. The RF power amplifier of claim 1, having an output power of at least 100 W.

11. The RF power amplifier of claim 1, wherein the at least one diode is a Schottky-barrier diode.

12. The RF power amplifier of claim 2, wherein the at least one FET of the at least two FETs is a Laterally Diffused Metal Oxide Semiconductor (LDMOS) FET.

13. The RF power amplifier of claim 1, wherein at least one diode is integrated in a same package of the at least one FET or is integrated on a same die as the at least one FET.

14. A generator comprising:
- a radio frequency (RF) power amplifier, comprising at least one FET, and at least one diode connected between a drain terminal of the at least one FET and ground;
- a control circuit configured to generate a plurality of input signals for the at least one FET;
- a direct-current (DC) power supply configured to supply the RF power amplifier with DC power; and
- an output which is configured to output amplified RF power,
- wherein the at least one diode has a lower threshold voltage than a body diode of the at least one FET.

15. A plasma system, comprising:
- a generator, the generator comprising:
- a radio frequency (RF) power amplifier, comprising at least one FET, and at least one diode connected between a drain terminal of the at least one FET and ground;
- a control circuit configured to generate a plurality of input signals for the at least one FET;
- a direct-current (DC) power supply configured to supply the RF power amplifier with DC power;
- an output which is configured to output amplified RF power; and
- a plasma tool connected to the output and configured to generate plasma using the amplified RF power,
- wherein the at least one diode has a lower threshold voltage than a body diode of the at least one FET.

* * * * *